US005136122A

United States Patent [19]

Kwitkowski et al.

[11] Patent Number: 5,136,122

[45] Date of Patent: Aug. 4, 1992

[54] BRAIDED FIBER OMEGA CONNECTOR

[75] Inventors: Peter A. Kwitkowski, St. Charles; Detlef W. Schmidt, Schaumburg; Carl Missele, Elgin, all of Ill.

[73] Assignee: Motorola, Inc., Schaumburg, Ill.

[21] Appl. No.: 699,019

[22] Filed: May 13, 1991

[51] Int. Cl.[5] ...................... H01R 11/00; H01R 43/02

[52] U.S. Cl. .................................... 174/94 R; 29/843; 29/885; 174/84 R; 219/56.22; 228/179; 439/887

[58] Field of Search ............... 174/84 R, 86, 90, 94 R; 29/843, 860, 874, 885; 228/110, 179; 439/886, 887; 219/561, 56.22

[56] References Cited

U.S. PATENT DOCUMENTS

| | | | |
|---|---|---|---|
| H. 498 | 7/1988 | Keller et al. | 174/94 R X |
| 2,253,375 | 8/1941 | Henninger | 219/56.22 |
| 4,719,317 | 1/1988 | Reynolds et al. | 174/94 R |
| 4,870,227 | 9/1989 | Saen et al. | 439/886 X |
| 4,907,991 | 3/1990 | Kobayashi | 29/843 |
| 4,978,814 | 12/1990 | Honour | 174/94 R X |
| 5,023,403 | 6/1991 | Eckardt et al. | 174/94 R |

FOREIGN PATENT DOCUMENTS

| | | | |
|---|---|---|---|
| 3837458 | 5/1990 | Fed. Rep. of Germany | 228/110 |
| 24244 | 2/1979 | Japan | 228/110 |
| 162847 | 12/1981 | Japan | 219/56.22 |
| 192688 | 11/1983 | Japan | 228/110 |

*Primary Examiner*—Morris H. Nimmo
*Attorney, Agent, or Firm*—Douglas D. Fekete

[57] ABSTRACT

An improved omega connector for electrically coupling components of a multicomponent electronic assembly comprises first and second flat end sections each formed of nonporous copper plate adapted for solder bonding to components, and an intermediate loop section formed of interwoven copper fibers extending between the end sections to provide a continous electrically conductive network therebetween. The fibers in the loop section carry a solder nonwettable coating to avoid interference with bonding operations to attach the end section to the components. Preferably, the loop section is composed of nickel-clad copper fibers. The fibrous loop section exhibits enhanced flexibility to reduce stresses attributed to shifting of the components during operation and thereby extend the useful life of the assembly.

17 Claims, 1 Drawing Sheet

BRAIDED FIBER OMEGA CONNECTOR

BACKGROUND OF THE INVENTION

This invention relates to an improved omega connector for electrically coupling two electronic components. More particularly, this invention relates to an omega connector having solid copper plate end sections solder bonded to the components and an intermediate loop section formed of interwoven copper fibers for enhanced flexibility.

In a typical multicomponent electronic assembly, electrical connections are made between components arranged in side-by-side relationship using an omega connector. The omega connector is commonly formed of a copper ribbon generally in a configuration corresponding to the Greek letter Ω, that is, having coplanar, flat end sections and an intermediate loop section. The components, typically printed circuit boards or the like, are positioned in a coplanar arrangement with adjacent edges spaced apart by a gap. The connector end sections are solder bonded to terminal pads on the components so that the loop section bridges the gap to provide the electrical interconnection.

During operation, the electronic assembly is subjected to temperature fluctuations that cause shifts in the relative positions of the components. This shifting tends to expand and contract the gap between the components. One advantage of the omega connector is that the loop section flexes to accommodate variations in the width of the gap. However, repeated cycling tends to harden the metal within the loop section and produce cracks that ultimately disrupt the electrical connection. Furthermore, the relative position of the components also tends to vary along the gap, that is, in a direction parallel to the component edges. This shifting also generates fatigue stresses within the loop section, which is accentuated due to the restricted flexibility of the copper strip across the width. These stresses may produce cracks that result in failure of the connection. However, a more common problem involves creep of the solder that bonds the end sections to the component. This creep is evidenced by a dramatic pulling away of the end section from the component pad and ultimately leads to failure of the solder bond, thereby breaking the connection with the component.

SUMMARY OF THE INVENTION

This invention contemplates an improved omega connector for electrically coupling two electronic components, which connector comprises an interwoven copper fiber loop section having enhanced flexibility both in the direction across the gap and in the direction along the gap to accommodate shifts in the relative positions of the components and thereby reduce fatigue-induced cracking within the connector and creep within solder bonds thereto. In this manner, the improved omega connector in accordance with this invention increases the life of the multicomponent assembly, despite repeated thermal cycling, more than a hundred fold as compared to conventional copper strip omega connectors.

In accordance with a preferred embodiment, an omega connector of this invention comprises first and second flat, generally coplanar end sections formed of nonporous copper plate and an intermediate loop section formed of interwoven copper fibers. The copper plate sections are adapted for solder bonding to suitable pads on the components. The copper fibers extend longitudinally between the end sections and are integrally formed therewith to provide a continuous electrically conductive network therebetween, which network is composed of a multitude of low resistance, fibrous electrical paths. Also, the copper fibers carry a solder nonwettable coating. A preferred coating is a nickel cladding. Alternately, the copper fibers may carry a polymer coating, such as a silicone rubber resin, of the type conventionally used as a solder stop.

In the manufacture of a multicomponent electronic assembly, the first and second end sections of the omega connector of this invention are solder bonded to terminal pads respectively on first and second electronic components arranged in side-by-side relationship separated by a gap. A strong solder bond is readily formed between the nonporous end plate and the pad. It is a feature of this invention that the end sections are not formed of copper fibers as in the loop section, which would tend to absorb solder alloy and thus remove the alloy from the pad to inhibit formation of the desired solder bond. Further, the nonwettable coating on the copper fibers of the loop section avoids wicking of the solder alloy into the loop section, which would also interfere with formation of the desired bond.

This invention further contemplates the product multicomponent assembly comprising at least two electronic components electrically coupled by the copper fiber omega connector. The connector end sections are solder bonded to terminal pads of the respective components, with the connector loop section bridging the gap between the components to provide the desired electrical communication across the gap. The discrete nature of the copper fibers within the loop section enhances flexibility of the connector to accommodate shifting in the relative position of the components during thermal cycling of the type experienced by the assembly during use. In this manner, the useful life of the assembly is dramatically increased, particularly in comparison to previous copper strip connectors.

This invention also includes a method for manufacturing the omega connector. In a preferred embodiment, the omega connector is formed from a singular, continuous strip of interwoven nickel-plated copper fibers. The strip comprises first and second portions spaced apart by an intermediate portion. Each end portion is cold welded, for example by localized application of ultrasonic energy, to bond the copper fibers there into a nonporous copper plate and thereby form the end section of the connector. The intermediate portion is shaped into a self-sustaining loop for the intermediate section of the connector. In an alternate embodiment, an omega connector in accordance with this invention is formed from a strip of uncoated copper fibers. After welding the end portions to form the end sections and shaping the intermediate portion to form the loop section, a microdroplet of suitable curable polymer precursor liquid is dispensed onto the loop section and is spread by capillary forces to coat the copper fibers. The precursor is then cured to produce a solder nonwettable coating on the copper fibers. In any event, the copper fiber omega connector is conveniently formed from interwoven copper fiber strip that is readily commercially available and using welding and forming steps that are conducive to mass production.

BRIEF DESCRIPTION OF THE DRAWINGS

The present invention will be further illustrated with reference to the following figures.

DETAILED DESCRIPTION OF THE INVENTION

Figure 1:
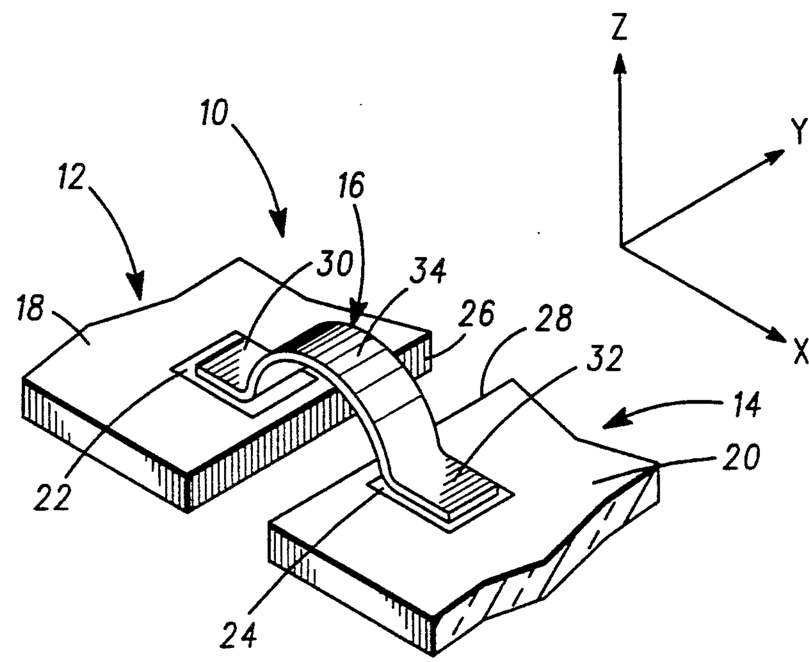
FIG. 1 is a perspective view showing a multicomponent electronic assembly comprising electronic components electrically coupled by a copper fiber omega connector of this invention.

In accordance with a preferred embodiment of this invention, referring to the figures, there is depicted a multicomponent electronic assembly 10 that includes a first printed circuit 12 and a second printed circuit board 14 connected by a braided copper fiber omega strip 16. Boards 12 and 14 comprise major faces 18 and 20 that include terminal bond pads 22 and 24, respectively, formed of copper or other suitable solder wettable metal. Boards 12 and 14 further include edges 26 and 28 and are arranged in side-by-side relationship, as depicted in the figure, with edges 26 and 28 parallel, but spaced apart by a gap. Bond pads 22 and 24 are operatively connected to electrical features (not shown) located elsewhere on boards 12 and 14 and are interconnected by omega connector 16.

Figure 2:
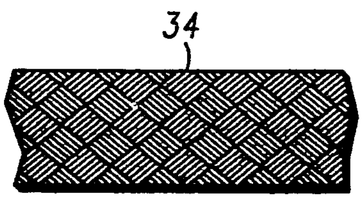
FIG. 2 is a top elevational view of the loop section of the omega connector in FIG. 1 showing the interwoven copper fiber pattern.

Omega connector 16 comprises first and second end sections 30 and 32 and an intermediate loop section 34. End sections 30 and 32 are formed of solid copper plates. In this embodiment, loop 34 is formed of nickel-plated copper fibers interwoven in a braid pattern as shown in FIG. 2. Omega connector 16 is manufactured from a continuous strip of braided nickel-plated copper fibers of the type that is commercially available for use in forming a shield electrode in the manufacture of coaxial cable. The connector is formed from the strip in the as-shipped, collapsed condition. A first portion of the strip is clamped between suitable jaws that are ultrasonically vibrated to cold weld the fibers into an integral plate of end section 30. Similarly, a second portion of the strip spaced apart from section 30 is ultrasonically welded to produce end section 32. Alternately, the end sections may be formed by resistance welding or any other suitable process for coalescing the several fibers into an integral plate. It is believed that the nickel from the coating becomes alloyed into the copper during welding, but produces a minor nickel content that does not significantly affect the properties of the welded plates. The portion of the strip intermediate the cold welded sections is then formed into a self-sustaining loop of section 34. Following welding and forming, the strip is severed to separate the end sections from adjacent portions of the strip and complete the omega connector.

Preferably, a series of connectors are sequentially manufactured from a continuous braided strip, in which event, adjacent portions of the strip are concurrently welded and severed to form end sections of successive connectors.

To produce electronic assembly 10, boards 12 and 14 are positioned in the desired arrangement with edges 26 and 28 spaced apart by a predetermined distance. Pads 22 and 24 are initially coated with a suitable solder paste composed of tinlead solder alloy microparticles and a flux compound dispersed in a vaporizable liquid vehicle. Connector 16 is positioned with the end sections 30 and 32 set upon paste-coated pads 22 and 24. The assembly is heated to a temperature sufficient to reflow the solder alloy at the interfaces between each end section and pad. This reflow is facilitated by the low porosity of the welded plate that prevents the liquid alloy from being absorbed into the end section. In addition, the nickel clad on the copper fiber surfaces is not wet by the liquified solder, which would otherwise result in wicking of the liquid solder into the loop section 34, thereby diminishing the solder available for bonding to the components and bonding of the fibers within the loop section into a rigid mass. Thus, solder is retained between the end sections and the corresponding pads and resolidifies upon cooling to produce the desired bonds.

The resulting assembly 10 thus comprises a first end section 30 of connector 16 bonded to pad 22 of first substrate 12 and a second end section 32 bonded to pad 24 of second substrate 14, with loop section 34 bridging the gap between components. The plurality of copper fibers that forms loop section 34 are integrally formed to the welded copper plates and extend longitudinally between end sections 30 and 32. Thus, the fibers provide an electrically conductive network for carrying current between the components.

Furthermore, because of the small diameter, the fibers within the loop section provide enhanced flexibility. Flexibility is further enhanced because the fibers are not bound together into a rigid strip, but rather form a bundle of discrete strands. When assembly 10 is subjected to thermal cycling during use, the relative positions of boards 12 and 14 tend to shift. Referring to the coordinate system indicated in FIG. 1, shifting may occur along the X axis in a direction across the gap perpendicular to component edges 26 and 28, along the Y axis in a direction parallel to edges 26 and 28 and along the Z axis normal to the plane of component faces 18 and 20. With regard to shifting in the X direction, loop section 34 flexes to accommodate increases and decreases in the distance between the end sections 30 and 32 affixed to the components. For purposes of comparison, a conventional omega connector formed of a solid copper strip also flexes to adjust to changes in the width of the gap, but such flexing is accompanied by a concentration of stress in the uppermost region of the loop that work hardens the metal and tends eventually to produce cracking that disrupts the electrical connection. However, the bundle of small diameter fibers in omega connector 16 of this invention exhibits enhanced flexibility to avoid the concentration of work hardening stress and the resulting cracking. With regard to relative movement of the components in the Y direction, the unbonded bundle of small diameter fibers readily flexes to relieve stress both within the loop section and at the solder bonds to the components, in marked contrast to the limited widthwise flexibility of a conventional solid copper ribbon connector. For purposes of comparison, multicomponent assemblies similar to assembly 10 in FIG. 1 were subjected to an accelerated fatigue test that included mechanical vibration in the Y direction comparable to shifting in the positions of the components of the type experienced during operation of an electronic assembly due to temperature fluctuations. It was found that an assembly comprising a copper fiber omega connector 16 withstood greater than 50,000 cycles without failure. In contrast, an assembly comprising a conventional copper ribbon connector failed after about 500 cycles. Thus, the omega connector 16 of this invention extended the useful life of the assembly by a factor of over 100.

Omega connector 16 also exhibits enhanced flexibility to accommodate shifts in the Z direction, although such shifts are generally not deemed to be a significant factor in reducing the useful life of the assembly.

In an alternate embodiment, an omega connector similar to connector 16 in the figures is derived from a braided strip of bare copper fibers, that is, copper fibers that do not carry a coating such as the nickel cladding in the first described embodiment. The portions of the braid were ultrasonically welded to produce the copper plates that form the end sections, whereafter the intermediate portion was formed into the desired loop shape. Thereafter, a microdroplet of an ultraviolet curable two-component silicone rubber precursor was dispensed onto the uppermost region of the loop. The liquid wet the copper fiber surfaces and spread within the loop section to produce a liquid layer which, upon exposure to ultraviolet radiation, was cured to produce a silicone rubber coating. The coating was not wet by liquid solder and was thus suitable to avoid wicking of the solder into the loop section during reflow to bond the end sections to the components. In this embodiment, the polymer coating tends to bond the fibers at points of contact within the bundle, nevertheless the increased elasticity of the silicone rubber, particularly relative to copper metal, enhances flexibility of the fiber bundle over conventional copper ribbon.

While this invention has been described in terms of certain examples thereof, it is not intended that it be limited to the above description but rather only to the extent set forth in the claims that follow.

We claim:

1. An omega connector for electrically coupling two electronic components, said connector comprising a first and a second flat end sections and an intermediate loop section, each said end section being formed of a copper plate adapted for solder bonding to a suitable pad, said loop section being formed of interwoven copper fibers having a solder nonwettable coating and being integrally connected to the end sections to provide a continuous electrically conductive network therebetween.

2. An omega connector for electrically coupling two electronic components, said connector comprising a first and a second flat end sections and an intermediate loop section, each said end section being formed of a nonporous copper plate adapted for solder bonding to a suitable pad, said loop section being formed of interwoven copper fibers having a solder nonwettable coating, said copper fibers extending longitudinally between said end sections and being integrally formed thereto to provide a multitude of electrical paths therebetween, said fibers being distinct within the loop section to enhance flexibility thereof.

3. An omega connector in accordance with claim 2 wherein the loop section is formed of nickel clad copper fibers.

4. An omega connector in accordance with claim 2 wherein the fiber coating is composed of a solder-nonwettable polymer.

5. An omega connector in accordance with claim 2 wherein the fiber coating is a silicone rubber polymer.

6. An omega connector in accordance with claim 2 wherein the end sections are formed of said copper fibers welded into an integral plate.

7. An electronic component assembly comprising a first and a second component in side-by-side relationship separated by a gap, and an omega connector bridging said gap to interconnect the components, said connector comprising a first and a second flat end sections and an intermediate loop section, said first and second end sections being formed of a copper plate solder and respectively bonded each to said first and second components, said loop section being formed of interwoven copper fibers having a solder nonwettable coating and being integrally connected to the end sections to provide a continuous electrically conductive network therebetween.

8. An electronic component assembly comprising a first and a second component in side-by-side relationship separated by a gap, and an omega connector interconnecting the components, said connector comprising a first and a second flat end sections and an intermediate loop section, each said end section being formed of a nonporous copper plate solder bonded to a said component, said loop section being formed of interwoven, discrete copper fibers integrally formed to said end sections and extending longitudinally therebetween bridging said intercomponent gap to provide a multitude of electrical paths therebetween.

9. An electrical component assembly in accordance with claim 8 wherein the connector loop section is formed of nickel clad copper fibers.

10. An electrical component assembly in accordance with claim 9 wherein the copper fibers have a solder-nonwettable polymer coating.

11. An electrical component assembly in accordance with claim 9 wherein the copper fiber coating is composed of a silicone rubber polymer.

12. An electronic component assembly comprising a first and a second component, each said component having a planar face, an edge intersecting the face, and a solder wettable bond pad disposed on said face, said components being arranged such that the faces are coplanar and said edges are spaced apart by a gap, and an omega connector interconnecting the components, said connector comprising a first and a second flat end section and an intermediate loop section, said first and second end sections being each formed of a nonporous copper plate and being solder bonded to the bond pad of said first and second components respectively, said loop section being formed of interwoven nickel-clad copper fibers integrally formed to said end sections and bridging said intercomponent gap extending longitudinally between said end sections to provide a multitude of electrical paths therebetween, said fibers being discrete within said loop section to provide enhanced flexibility to reduce stress attributable to shifting in the relative position of said components.

13. A method for making an omega connector comprising first and second end sections and an intermediate loop section, providing a flexible interwoven copper fiber strip having spaced first and second portions and an intermediate portion, welding said fibers within the first and second portions to bond the copper to form copper plates and thereby form said first and second end sections, and shaping the intermediate section to form a loop.

14. A method for making an omega connector in accordance with claim 13 wherein the strip is formed of nickel-clad copper fibers.

15. A method for making an omega connector in accordance with claim 13 wherein said welding comprises ultrasonically welding.

16. A method for making an omega connector in accordance with claim 13 wherein the strip is formed of bare copper fibers and further comprising dispensing onto the loop section a polymer precursor liquid suitable for forming a polymer that is nonwettable by solder alloy, said precursor liquid wetting copper fiber surfaces within section, and curing the precursor to form a solder-nonwettable coating on said copper fiber surfaces.

17. A method for making an omega connector in accordance with claim 16 wherein the polymer coating is composed of a silicone rubber polymer.

* * * * *